(12) United States Patent
Hsue et al.

(10) Patent No.: US 6,410,386 B1
(45) Date of Patent: Jun. 25, 2002

(54) METHOD FOR FORMING A METAL CAPACITOR IN A DAMASCENE PROCESS

(75) Inventors: Chen-Chiu Hsue, Hsinchu; Shyh-Dar Lee, Hsinchu Hsien; Jen-Hann Tsai, Tianan, all of (TW)

(73) Assignee: Silicon Integrated Systems Corp. (TW)

( * ) Notice: Subject to any disclaimer, the term of this patent is extended or adjusted under 35 U.S.C. 154(b) by 0 days.

(21) Appl. No.: 09/881,102

(22) Filed: Jun. 15, 2001

(51) Int. Cl.$^7$ .......................... H01L 21/8242

(52) U.S. Cl. ...................... 438/253; 438/687

(58) Field of Search .................. 438/238–240, 438/253–256, 381, 390–399, 687

(56) References Cited

U.S. PATENT DOCUMENTS 6,159,839 A * 12/2000 Jeng et al.
6,180,976 B1    1/2001 Roy

* cited by examiner

Primary Examiner—Jey Tsai (57) ABSTRACT

A method for forming a metal capacitor in a damascene process is provided. Before the metal capacitor is formed, the underlying interconnections are fabricated with Cu metal by damascene processes. The capacitor is formed by depositing a first metal layer, an insulator and a second metal layer. The stacked layers are then subjected to a masking process and an etching process to form the thin-film capacitor and the metal wire with the remaining insulator and the remaining second metal layer thereon. The remaining second metal layer located on the metal wire is removed by another masking process and another etching process. After forming the capacitor and the metal wire, the upper interconnections are fabricated with Cu metal by damascene processes.

10 Claims, 8 Drawing Sheets

METHOD FOR FORMING A METAL CAPACITOR IN A DAMASCENE PROCESS

BACKGROUND OF THE INVENTION

1. Field of the Invention

The present invention relates in general to the formation of an integrated circuit including capacitors. In particular, the present invention relates to a method for forming a metal capacitor in a damascene process.

2. Description of the Related Art

Capacitors are deployed in various integrated circuits. For example, decoupling capacitors provide improved voltage regulation and noise immunity for power distribution. Capacitors also have wide applications in analog/logic, analog-to-digital, mixed signal, radio frequency circuit operations, and others.

Figure 1A:
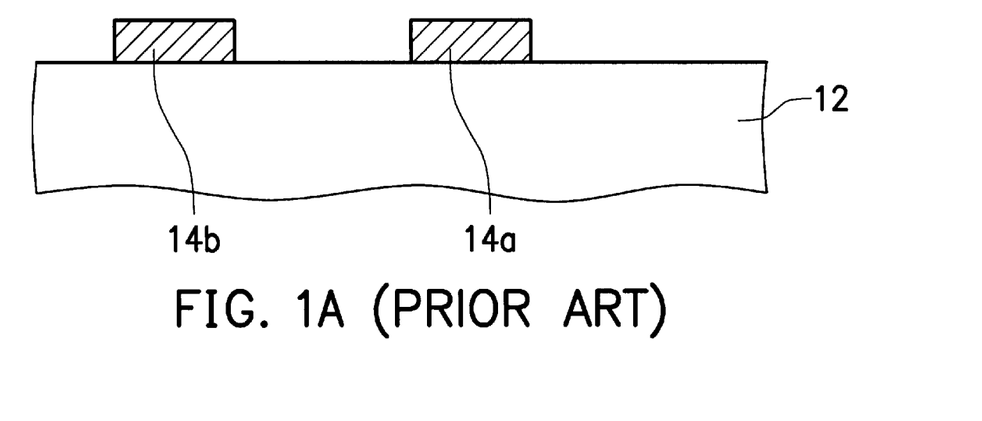
FIGS. 1A~1D depict the method for integrating the capacitors into the interconnection processes according to the prior art.
Figure 1B:
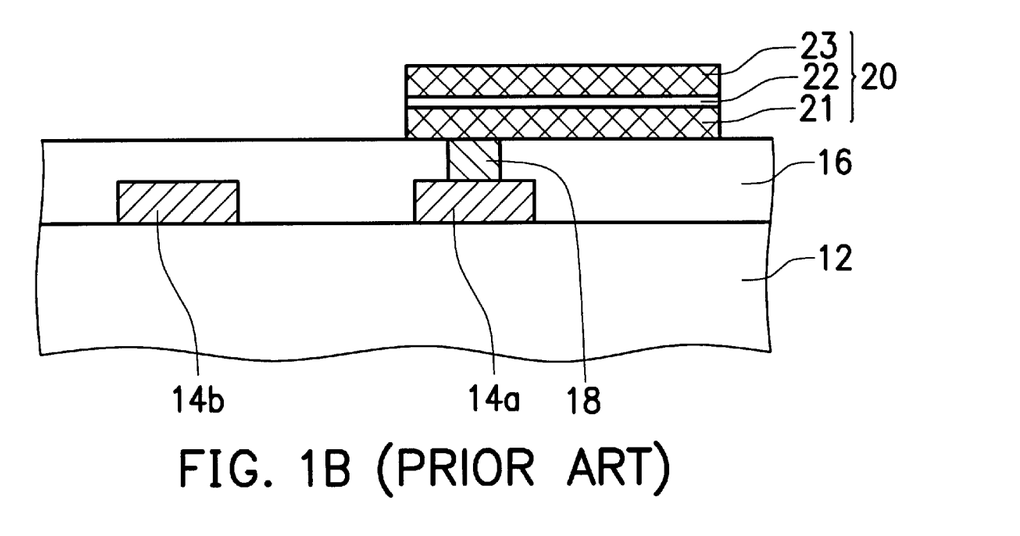
Figure 1C:
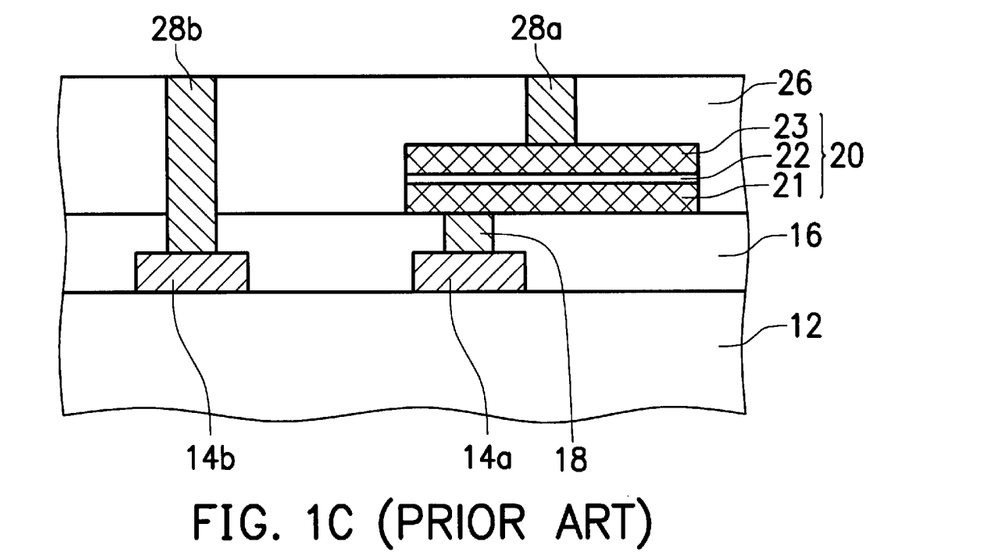
Figure 1D:
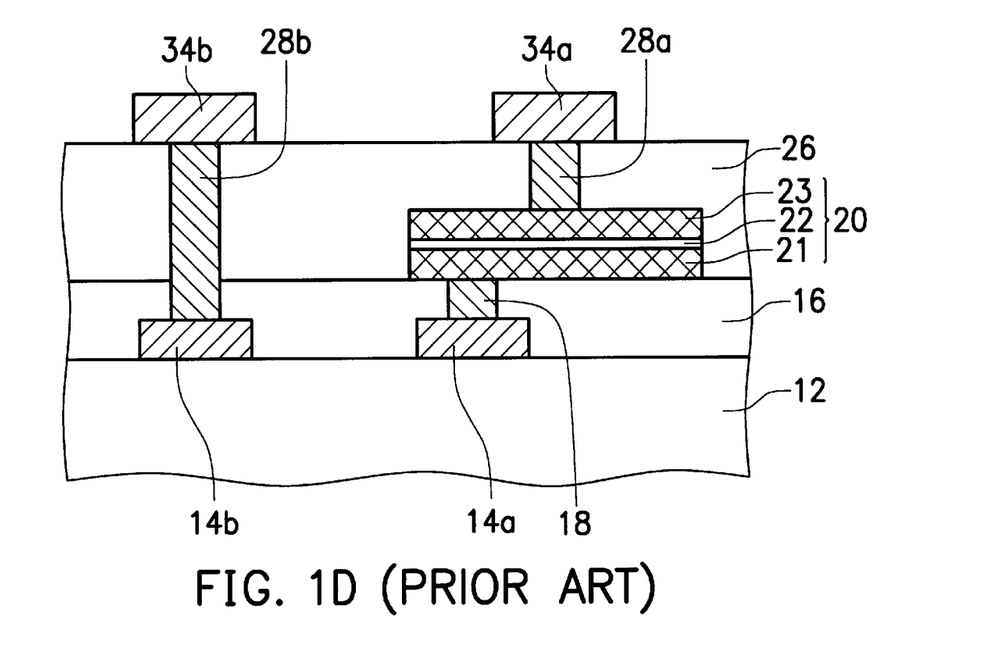

A conventional method of manufacturing a semiconductor apparatus including a capacitor 20 that is formed of metal-insulator-metal layers is described with reference to FIGS. 1A~1D. As shown in FIG. 1A, an aluminum layer is deposited on an insulator 12 which contains interconnections and is formed on a silicon substrate having devices (not shown) thereon and therein. The aluminum layer is then patterned by masking and etching to form wires 14a and 14b. As shown in FIG. 1B, an insulator 16 with a tungsten plug 18 (hereafter "W-plug") used to connect the aluminum wire 14a and the to-be-formed capacitor is formed on the aluminum wires 14a and 14b and the insulator 12. As shown in FIG. 1C, a first conductive plate 21, an insulator 22 and a second conductive plate 23 are sequentially deposited on the insulator 16 and the W-plug 18, and then patterned by masking and etching to obtain a capacitor 20. The first conductive plate 21, the lower electrode, is connected with the aluminum wire 14a through the W-plug 18. Another insulator 26 is deposited on the insulator 16 and the capacitor 20. The insulators 16 and 26 are patterned and W-plug 28a and W-plug 28b are formed therein. As shown in FIG. 1D, an aluminum layer is deposited on the insulator 26 and the W-plugs 28a and 28b. The aluminum layer is then patterned by masking and etching to form wires 34a and 34b. The aluminum wire 34a is connected with the second conductive plate 23 through the W-plug 28a. The aluminum wire 34b is connected with the aluminum wire 14b through the W-plug 28b.

The above-mentioned traditional processes for integrating the capacitor 20 into an integrated circuit require several masking and etching steps to form the capacitor 20, which may increase overall fabrication costs.

As well, the aluminum used to fabricate the traditional interconnections cannot satisfy present-day requirements for enhanced integration and highly demanding speeds of data transmission. Copper (Cu) has high electric conductivity to reduce RC delay and can be substituted for the aluminum in the conductive wires. The use of copper in the conductive wires requires the use of processes, that is, damascene processes, because copper cannot be patterned by etching. This is because the boiling point of the copper chloride ($CuCl_2$) produced by copper and the chlorine plasma usually used to etch metal is relatively high, about 1500° C.

A thin-film capacitor formed by combining with the Cu damascene proceees is disclosed in U.S. Pat. No. 6,180,976 B1. In the '976 B1 patent, the lower electrode of the thin-film capacitor is also formed by the damascene process. The '976 B1 patent has the advantage of saving a masking step. However, a chemical mechanical polishing process is required to remove undesired metal residue to form the lower electrode. Dishing is likely to occur on the lower electrode and result in an uneven surface. Therefore, the thickness of the insulator can not be kept uniform to stablize the electrical properies of the capacitors.

SUMMARY OF THE INVENTION

It is an object of the present invention to provide an improved method for forming a metal capacitor in a damascene process.

It is another object of the present invention to reduce the masking steps required to form a metal capacitor in a damascene process.

Yet another object of the invention is to reduce the cost of manufacturing an integrated circuit including a capacitor.

It is a further object of the invention to provide easily controllable processes of manufacturing an integrated circuit including a capacitor.

The present invention provides a method for forming a metal capacitor with a damascene process. Before fabricating the thin-film metal capacitor, a first Cu wire and a second Cu wire, surrouded with a barrier layer and a first sealing layer, are prepared in a first insulator. A second insulator and a stop layer are formed on the sealing layer in sequence. The first and second Cu plugs are disposed in the first sealing layer, the second insulator and the stop layer. A first metal layer, a fourth insulator and a second metal layer are formed on the stop layer in sequence. The second metal layer, the fourth insulator and the first metal layer are subjected to photolithography and etching processes to form a conductive wire with a remaining fourth insulator and a remaining second metal layer thereon and a capacitor. A lower electrode of the capacitor is connected with the first Cu wire through the first Cu plug and the conducting wire is connected with the second Cu wire through the second Cu plug. The remaining second metal layer is then removed. A fifth insulator with a flat surface is formed on the capacitor, the remaining fourth insulator and the third insulator. A plurality of dual damascene structures, including a third plug, a fourth Cu plug, a third Cu wire and a fourth Cu wire, are formed in the fifth insulator. An upper electrode of the capacitor is connected with the third Cu wire through the third Cu plug, and the conducting wire is connected with the fourth Cu wire through the fourth Cu plug. A second sealing layer is formed, covering at least the third and fourth Cu wires.

These and other objects of the present invention will become readily apparent upon further review of the following specification and drawings.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

The present invention provides a method to fabricate a thin-film capacitor which can be integrated into the Cu damascene processes. The thin-film capacitor has an insulator with a uniform thickness and a flat surface. Before the thin-film capacitor is formed, the underlying interconnections are fabricated with Cu metal by damascene processes. The capacitor is formed by depositing a first metal layer, an insulator and a second metal layer. The stacked layers are then subjected to a masking process and an etching process to form the thin-film capacitor and the metal wire with the remaining insulator and the remaining second metal layer thereon. The remaining second metal layer located on the metal wire is removed using another masking process and another etching process. After forming the capacitor and the metal wire, the upper interconnctions are fabricated with Cu metal by damascene processes.

Embodiment

A method for forming a metal capacitor in a damascene process according to the first embodiment of the present invention is described below with reference to FIGS. 2A~2L.

Figure 2A:
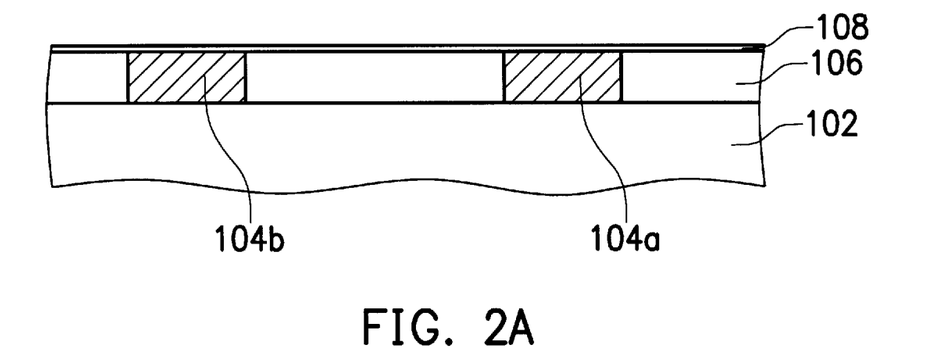
FIGS. 2A~2L depict the method for forming a metal capacitor in a damascene process according to the embodiment of the present invention.

Referring to FIG. 2A, the insulator 106 is formed on the insulator 102. The insulator 102 may include interconnections, and the insulator 102 is formed on a substrate, for example silicon semiconductor substrate, which includes numerous devices thereon and therein. The particular designs of the underlying integrated circuit have not been shown in order to highlight the various aspects of the present invention. Copper wires 104a and 104b, preferably about 2,000~6,000 Å, are formed in the insulator 106 by a damascene process. For example, first, trenches are formed in the insulator 106, and the barrier layer (not shown) is comformally formed on the insulator 106. After copper metal is formed on the barrier layer and fills in the trenches, a chemical mechanical polish process is executed to remove the undesired copper and barrier layer. A sealing layer 108, preferably about 100~1000 Å in thickness, is formed at least on the Cu wires 104a and 104b. In this figure the sealing layer 108 is formed on the insulator 106 and the Cu wires 104a and 104b as an example. The material of the sealing layer 108 can be silicon nitride or silicon carbide.

Figure 2B:
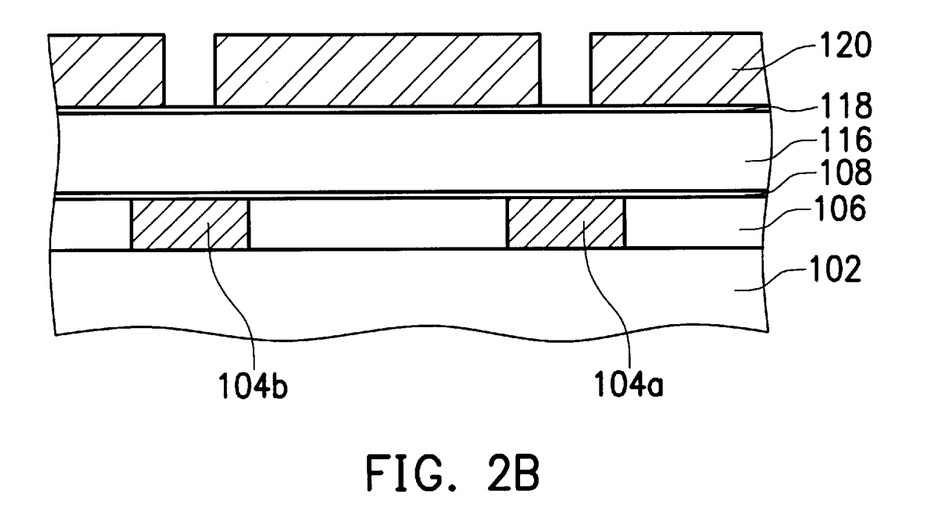

Referring to FIG. 2B, the insulator 116 and the insulator 118 which is acted as an etch stop layer are sequentially formed on the sealing layer 108. The material of the insulator layer 118, for example silicon nitride (SiN), is different from that of the insulator 116, for example silicon dioxide ($SiO_2$). The photoresist layer 120 with via patterns covers the insulator 118.

Figure 2C:
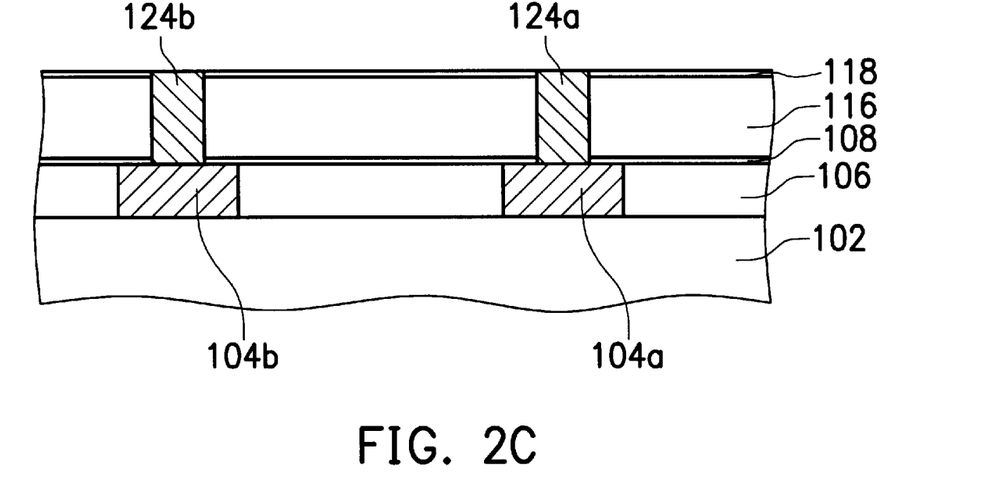

Referring to FIG. 2C, the via patterns of the photoresist layer 120 are transferred into the insulator 118, the insulator 116 and the sealing layer 108 to form vias exposing the contact regions of the Cu wires 104a and 104b. The photoresist layer 120 is then removed by, for example, a dry or wet process. The Cu plugs 124a and 124b are formed in the vias by, for example, depositing a conformal barrier layer and a Cu layer and polishing the undesired portion with planarization, for example, a chemical mechanical polishing process.

Figure 2D:
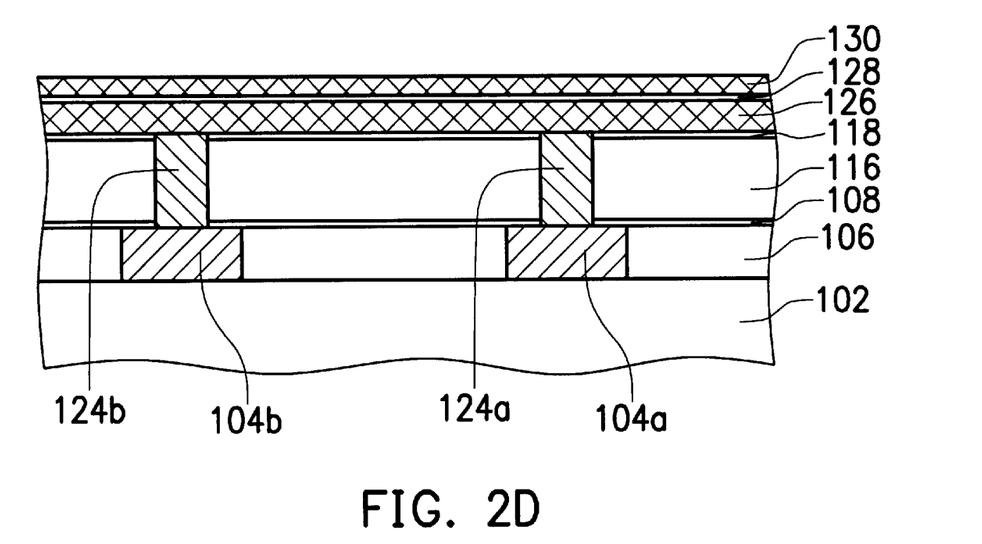

Referring to FIG. 2D, the metal layer 126, the insulator 128 and the metal layer 130 are formed on the insulator 118 and the Cu plugs 124a and 124b. The metal layer 126, with a thickness ranging from about 300 Å to about 2,000 Å, will be formed as a lower electrode of the capacitor and a conductive wire for a part of the interconnections. The insulator 128, with a thickness ranging from about 100 Å to about 1,200 Å, will be formed as a capacitor insulator, however, the particular thickness of this insulator 128 depends on the particular application of the capacitor with a desired capacitance. The metal layer 130, with a thickness ranging from about 200 Å to about 1,500 Å, will be formed as a upper electrode of the capacitor. The material used to form the metal layer 130 can be titanium (Ti), titanium nitride (TiN), tantalum (Ta), tantalum nitride (TaN), aluminum (Al), aluminum copper alloy (AlCu), or others. The material of the insulator 128 has a high dielectric constant, and can be silicon nitride (SiN), silicon oxynitride (SiON), silicon carbide (SiC), tantalum oxide ($TaO_2$), zirconium oxide ($ZrO_2$), hafnium oxide ($HfO_2$), aluminum oxide ($Al_2O_3$) or other high dielectric constant materials. The material used to form the metal layer 126 is any commonly used conductive material, for example aluminum (Al), aluminum copper alloy (AlCu), silver (Ag) or aurum (Au).

Figure 2E:
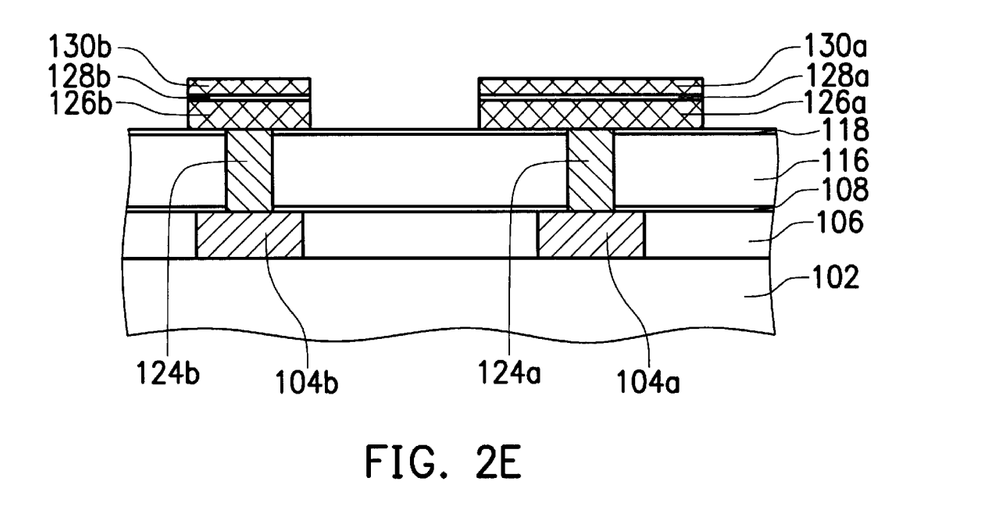

With Reference to FIG. 2E, the metal layer 130, the insulator and the metal layer 126 are patterned to obtain a conductive wire 126b with an insulator 128b and a metal layer 130b thereon and a capacitor 132 comprising an upper electrode 130a, a capacitor insulator 128a and a lower electrode 126a using a masking step and an etching step. When conducting the etching step, the insulator 118 functions as an etching stop layer.

For removing the undesired metal layer 130b, another masking step and another etching step are executed as shown in FIGS. 2F~2I.

Figure 2F:
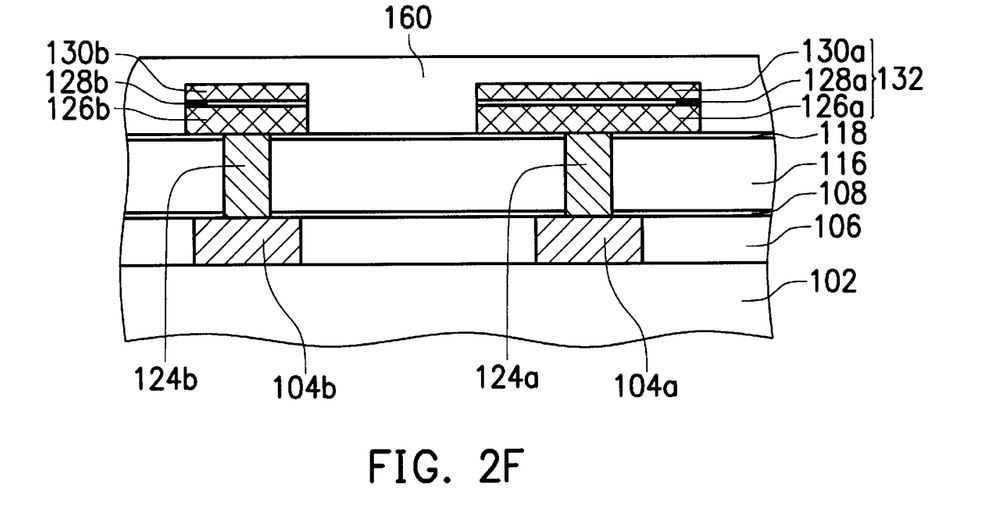

With Reference to FIG. 2F, a sacrificial layer 160 is formed on the capacitor 132, the metal layer 130b and the insulator 118 with a substantially flat surface. The sacrificial layer 160 is used to improve the subsequent photo process. The material used to form the sacrificial layer 160 can be polymer.

Figure 2G:
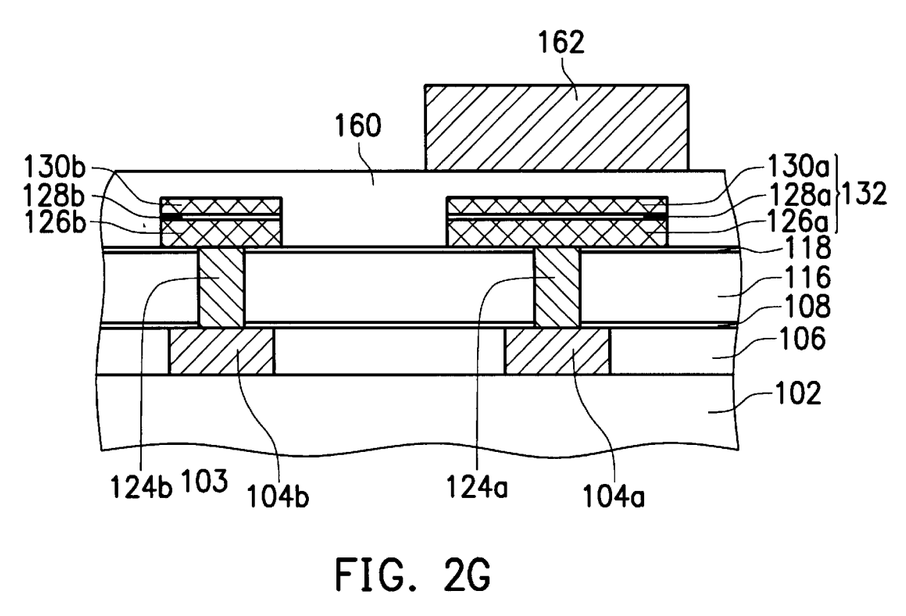

As shown in FIG. 2G, a patterned photoresist layer 162 is formed on the sacrificial layer 160. Because the underlayer, the sacrificial layer 160, has a flat surface, the patterned photoresist layer 162 can achieve the correct pattern after exposure and development.

The pattern of the patterned photoresist layer 162 corresponds roughly to that of the upper electrode 130a. The area of the patterned photoresist layer 162 can be equal to, smaller than or larger than that of the upper electrode 130a. In the figure, the area of the patterned photoresist layer 162 being larger than that of the upper electrode 130a is taken as an example.

Figure 2H:
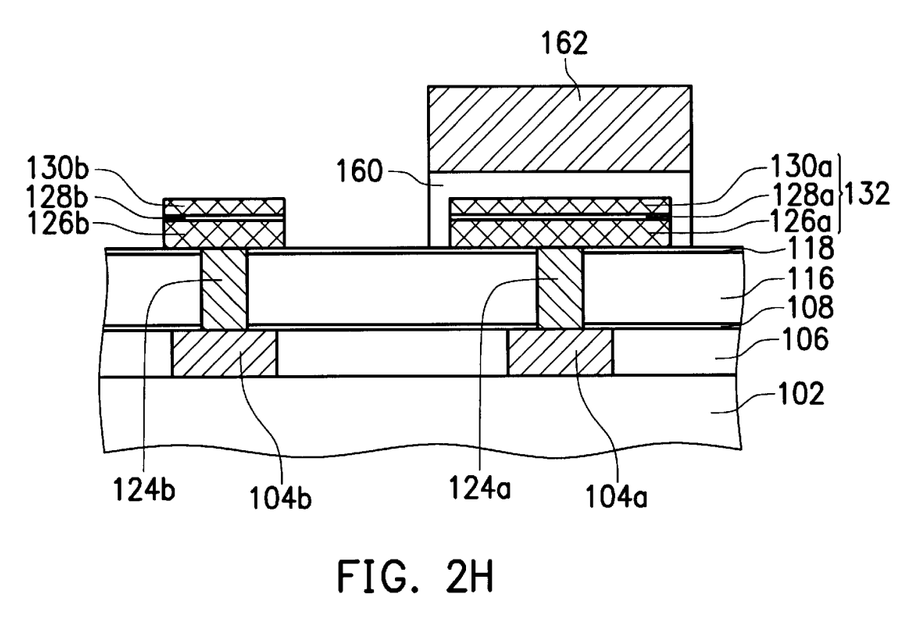

As shown in FIG. 2H, an etching step is executed to remove the metal layer 130b as well as the uncovered sacrificial layer 160 using the patterned photoresist layer 162 as a mask. The sacrificial layer 160 can be thoroughly removed or partial removed for the uncovered portion.

Figure 2I:
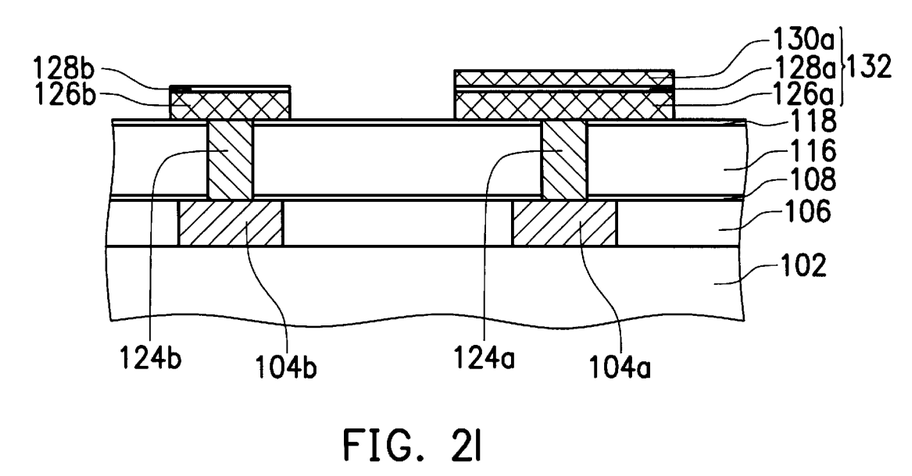

As shown in FIG. 2I, the patterned photoresist layer 162 and the remaining sacrificial layer 160 are removed.

According to the above-mentioned steps, only one additional single mask is required to make the capacitor 132. Accordingly, the number of masking and etching steps in manufacturing an integrated circuit, including a capacitor, are reduced, as is the cost of manufacturing.

Compared to the U.S. Pat. No. 6,180,976 B1., the capacitor 132 of the present invention has a relatively uniform and even capacitor insulator 128a, because the lower electrode 126a has a uniform and even surface formed by depositing and etching steps. Therefore, the capacitor 132 of the present invention has better electricial properties.

Figure 2J:
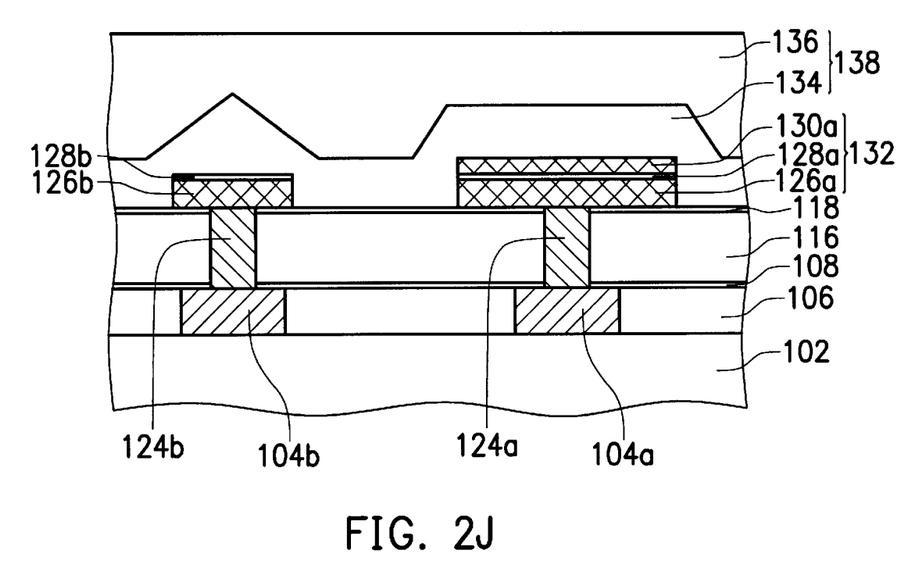

Now turnning to FIG. 2J, an insulator 134 with good gap-filling properties covers the insulator 118, insulator 128b and capacitor 132. The insulator 134 is formed by high-density plasma technology to deposit the silicon oxide, or by coating the silicon-on glass (SOG) or silicon-on polymer (SOP). A blanket sacrificial insulator 136 is formed on the insulator 134. The blanket sacrificial insulator 136 is then subjected to a planarization process, for example a chemical mechanical polishing process. Therefore, the insulator 136 has a planar surface to facilitate the subsequent processes. For the convenience of description, the insulator 134 and the insulator 136 are referred to as insulator 138 in the following figures and specification.

Figure 2K:
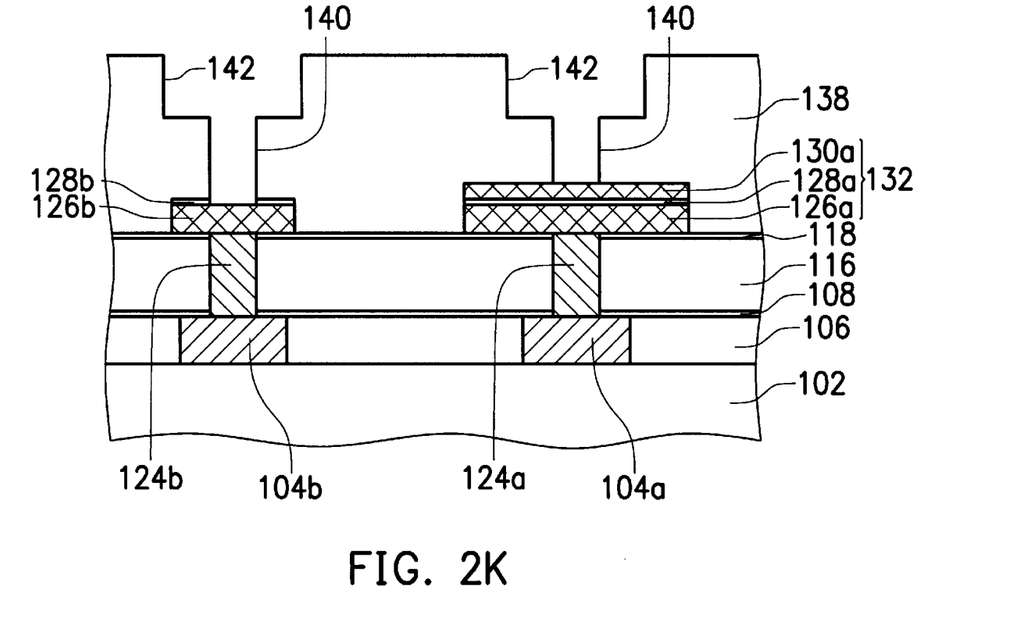
Figure 2L:
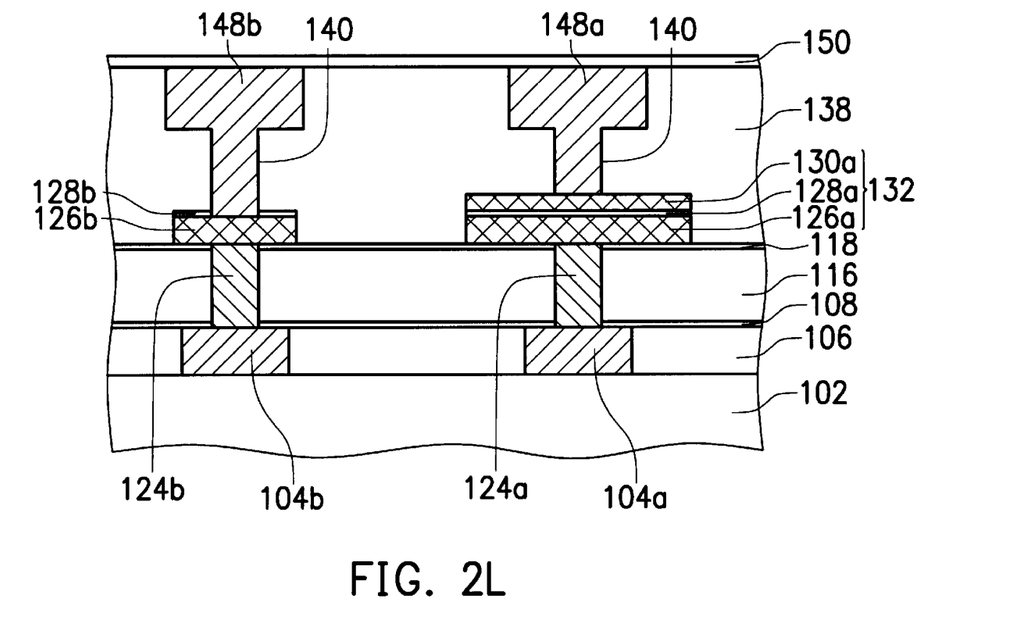

A dual damascene process is performed, as shown in FIGS. 2K and 2L. The dual damascene patterns including trenches 142 and vias 140 are formed in the insulator 138 and insulator 128b. The to-be-contact regions of the conductive wire 126b and the upper electrode 130a are exposed through the vias 140.

With Reference to FIG. 2L, a barrier layer (not shown) is conformally formed over the insulator 138, in the trenches 142 and vias 140. Cu metal is formed above the barrier layer and fills in the trenches 142 and vias 140. A chemical mechanical polishing process is performed to remove undesired Cu residue and the barrier layer to form Cu wires 148a and 148b and Cu plugs 146a and 146b. A sealing layer 150 is formed on the insulator 138 and the Cu wires 148a and 148b. The material used to fabricate the sealing layer 150 can be silicon nitride or silicon carbide, which are used in order to prevent the Cu atoms of the wires 148a and 148b from diffusing. The upper electrode 130a is connected with the Cu wire 148a through the Cu plug 146a, and the conductive wire 126b is connected with the Cu wire 148b through the Cu plug 146b.

Sequential interconnection processes (e.g. Cu processes) are performed until the interconnections are completed.

The above-mentioned insulators 102, 106, 116, 134 and 136 can be formed by low dielectric constant (K) materials, for example doped or undoped silicon oxide, SOP low K material, for example FLARE®, Si4C®, PAE-II® and so on, and CVD low K material, for example blackdiamond™ (BD™), Coral™, Greendot™, Aurora™ and so on.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A method for forming a metal capacitor in a damascene process, comprising:

providing a first insulator;

forming a first Cu wire and a second Cu wire in the first insulator by executing a damascene process;

forming a first sealing layer at least on the first and the second Cu wires;

forming a second insulator on the first sealing layer;

forming a third insulator acting as an etch stop layer on the second insulator;

forming a first Cu plug and a second Cu plug in the first sealing layer, the second insulator and the third insulator;

forming a first metal layer on the third insulator and the first and second Cu plugs;

forming a fourth insulator on the first metal layer;

forming a second metal layer on the fourth insulator;

patterning the second metal layer, the fourth insulator and the first metal layer to form a capacitor and a conducting wire with a remaining fourth insulator and a remaining second metal layer thereon, wherein a lower electrode of the capacitor is connected with the first Cu wire through the first Cu plug and the conducting wire is connected with the second Cu wire through the second Cu plug;

removing the remaining second metal layer;

forming a fifth insulator with a flat surface on the upper electrode, the fourth insulator and the third insulator;

forming dual damascene structures including a third plug, a fourth Cu plug, a third Cu wire and a fourth Cu wire in the fifth insulator, wherein an upper electrode of the capacitor is connected with the third Cu wire through the third Cu plug, and the conducting wire is connected with the fourth Cu wire through the fourth Cu plug; and forming a second sealing layer covering at least the third and fourth Cu wires.

2. The method as claimed in claim 1, wherein the material of the first metal layer is selected from the group consisting of Al, AlCu, Cu, Ag, and Au.

3. The method as claimed in claim 1, wherein the material of the fourth insulator is selected from the group consisting of silicon nitride (SiN), silicon oxynitride (SiON), silicon carbide (SiC), tantalum oxide ($TaO_2$), zirconium oxide ($ZrO_2$), hafnium oxide ($HfO_2$), and alumium oxide ($Al_2O_3$).

4. The method as claimed in claim 1, wherein the material of the second metal layer is selected from the group consisting of titanium (Ti), titanium nitride (TiN), tantalum (Ta), tantalum nitride (TaN), aluminum (Al), and aluminum copper alloy (AlCu).

5. The method as claimed in claim 1, wherein the step of removing the remaining second metal layer comprises:

coating a sacrificial layer over the remaining second metal layer, the capacitor and the third insulator;

forming a patterned photoresist layer on the sacrificial layer corresponding to the capacitor;

etching the sacrificial layer and the remaining second metal layer until the remaining fourth insulator is exposed; and removing the patterned photoresist layer and the sacrificial layer.

6. The method as claimed in claim 5, wherein the material used to form the sacrificial layer is polymer.

7. The method as claimed in claim 1, wherein the region of the lower electrode is equal to that of the upper electrode.

8. The method as claimed in claim 1, wherein the region of the lower electrode is larger than that of the upper electrode.

9. The method as claimed in claim 1, wherein the thickness of the second metal layer ranges from 200 Å to 1,500 Å.

10. The method as claimed in claim 1, wherein the thickness of the first metal layer ranges from 300 Å to 2,000 Å.

* * * * *